United States Patent
Bhatt et al.

(10) Patent No.: US 7,170,340 B1
(45) Date of Patent: Jan. 30, 2007

(54) APPARATUS AND METHOD FOR A CLASS D AUDIO POWER AMPLIFIER WITH A HIGHER-ORDER SIGMA-DELTA TOPOLOGY

(75) Inventors: Ansuya P. Bhatt, Cupertino, CA (US); Sumant Bapat, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 67 days.

(21) Appl. No.: 11/043,628

(22) Filed: Jan. 25, 2005

(51) Int. Cl.
*H03F 3/38* (2006.01)
(52) U.S. Cl. .......................... 330/10; 330/251
(58) Field of Classification Search .................. 330/10, 330/207 A, 251
See application file for complete search history.

(56) References Cited

U.S. PATENT DOCUMENTS

| | | | | |
|---|---|---|---|---|
| 5,055,843 A | * | 10/1991 | Ferguson et al. | 341/143 |
| 5,886,656 A | * | 3/1999 | Feste et al. | 341/143 |
| 5,949,361 A | * | 9/1999 | Fischer et al. | 341/143 |

* cited by examiner

*Primary Examiner*—Henry Choe
(74) *Attorney, Agent, or Firm*—Darby & Darby P.C.; Matthew M. Gaffney

(57) ABSTRACT

A class D power amplifier is provided to drive a low impedance load for audio applications. The amplifier includes a sigma-delta modulator circuit including three or more integrators that are arranged for third or higher order sigma-delta modulation. Also, the sigma-delta modulator circuit includes a quantizer circuit that is arranged to provide a sigma-delta modulator output signal based on a three-level switching scheme. The class D power amplifier drives a speaker based on the three-level switching scheme so that the output switches between three levels: VDD, 0, and −VDD, based on the input signal.

20 Claims, 10 Drawing Sheets

APPARATUS AND METHOD FOR A CLASS D AUDIO POWER AMPLIFIER WITH A HIGHER-ORDER SIGMA-DELTA TOPOLOGY

FIELD OF THE INVENTION

The invention is related to class D amplifiers, and in particular, to a class D power amplifier employing a third or higher order sigma-delta topology and three-level output switching.

BACKGROUND OF THE INVENTION

In audio applications, a speaker may be driven by an amplifier, typically a class AB amplifier. However, class AB amplifiers have low power efficiency. In portable applications, such as cell phones, personal desktop assistants (PDAs), and headphone amplifiers, battery life can be a significant concern. Also, in high-power systems, (e.g. 5 W–300 W), metal heat sinks are typically required because the low efficiency of Class AB amplifiers.

Compared to class AB amplifiers, class D amplifiers have much higher efficiency. A class D architecture could significantly increase the battery life in portable systems, and could allow multi-channel high-power systems to be designed very light and compact by eliminating the heat sinks that are typically employed.

Class D amplifiers typically employ either pulse width modulation or sigma-delta modulation. After initial conditioning of the audio signal, the signal is typically modulated by a high-frequency carrier signal. Also, the output stage of a class D amplifier is typically a pair of power MOSFETs which operate as switches to couple the output to VDD or ground based on the modulated signal. The output is generally low-pass filtered and provided to a speaker or a headphone for audio applications.

BRIEF DESCRIPTION OF THE DRAWINGS

Non-limiting and non-exhaustive embodiments of the present invention are described with reference to the following drawings, in which.

DETAILED DESCRIPTION

Figure 1:
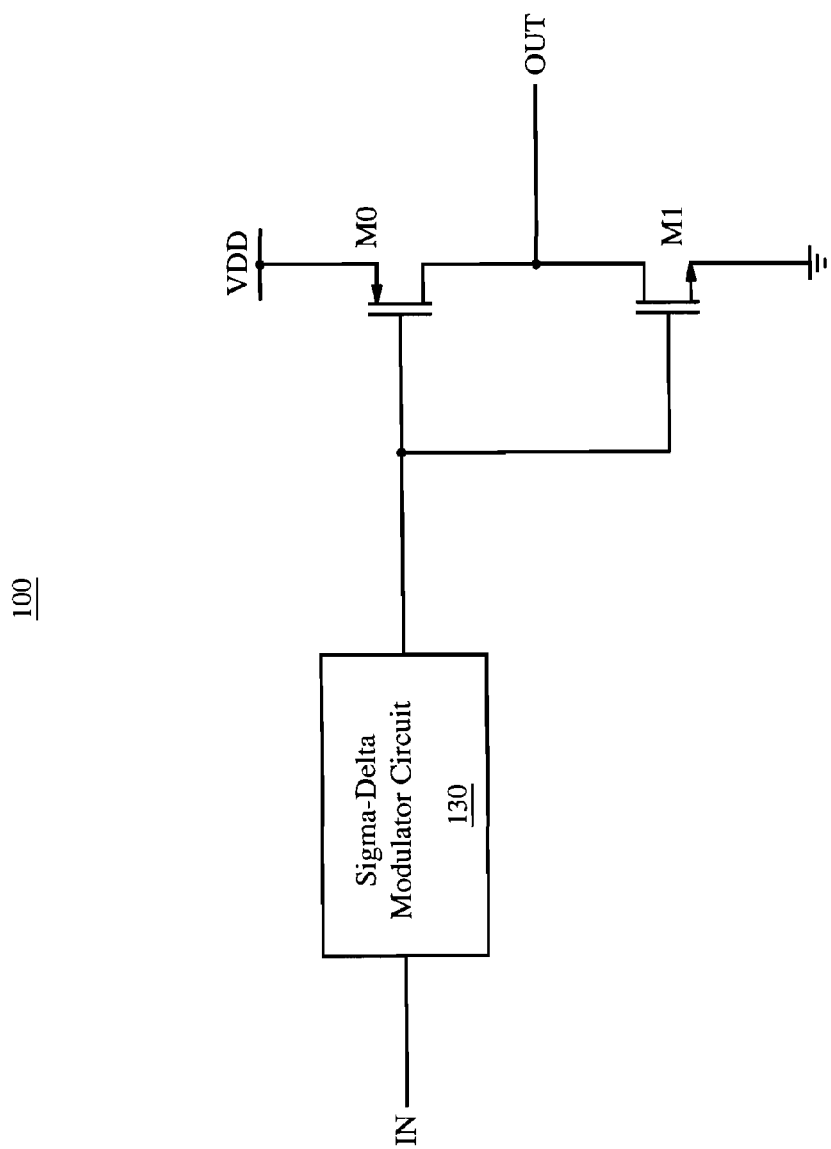
FIG. 1 illustrates a block diagram of an embodiment of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a class D audio power amplifier. The amplifier includes a sigma-delta modulator circuit including three or more integrators that are arranged for third or higher order sigma-delta modulation. Also, the sigma-delta modulator circuit includes a quantizer circuit that is arranged to provide a sigma-delta modulator output signal based on a three-level switching scheme. The class D power amplifier drives a speaker based on the three-level switching scheme so that the output switches between three levels: VDD, 0, and –VDD. In another embodiment, a two-level switching scheme is employed, so that the output switches between two levels.

FIG. 1 illustrates a block diagram of an embodiment of circuit 100. Circuit 100 includes sigma-delta modulator circuit 130 and power transistors M0 and M1. In one embodiment, circuit 100 is a class D power amplifier. Sigma-delta modulator circuit 130 is arranged to provide third or higher order sigma-delta modulation for input signal IN. Further, the gates of power transistors M0 and M1 are each driven based in part on the sigma-delta modulation performed by sigma-delta modulator circuit 130. In one embodiment, transistors M0 and M1 are arranged to provide signal OUT.

Figure 2:
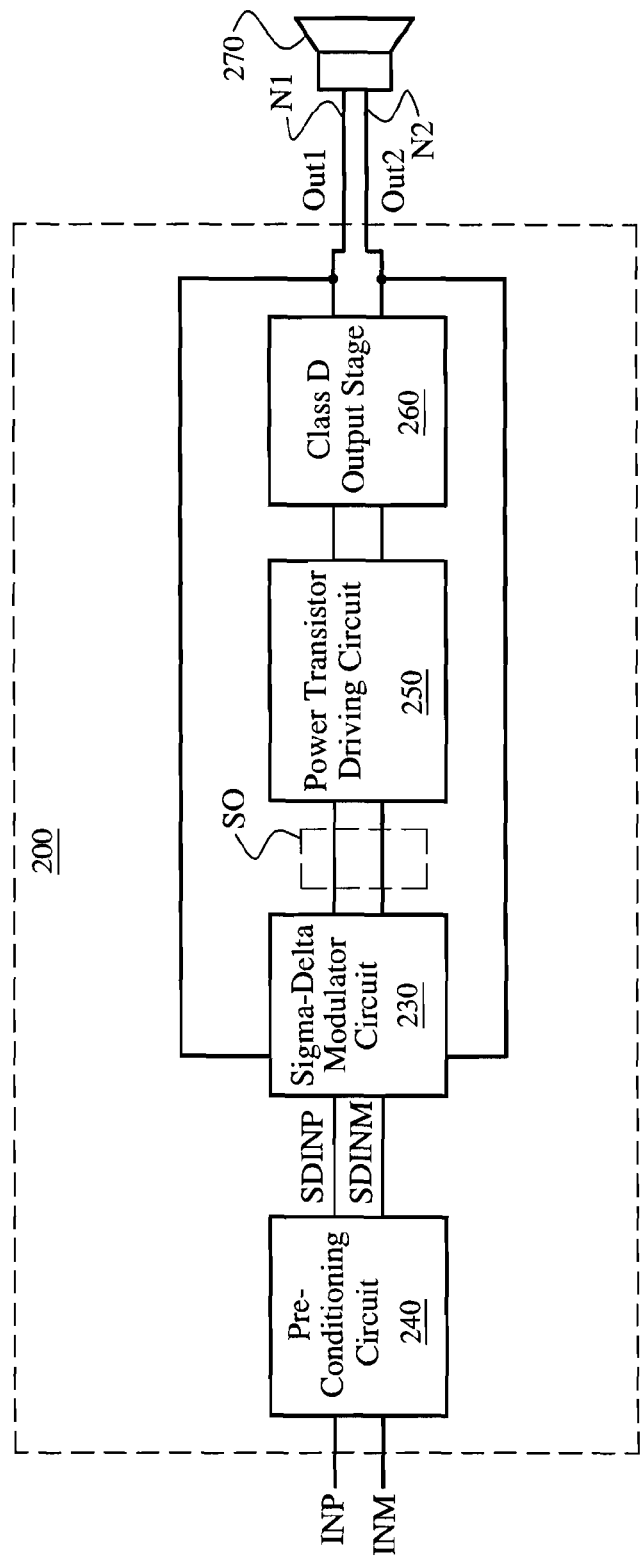
FIG. 2 shows a block diagram of an embodiment of a class D amplifier that may be employed as an embodiment of the circuit of FIG. 1, and a speaker.

FIG. 2 shows a block diagram of an embodiment of class D amplifier 200 and speaker 270. Class D amplifier 200 may be employed as an embodiment of circuit 100 of FIG. 1. Components in class D amplifier 200 may operate in a similar manner to similarly-named components in circuit 100 of FIG. 1, and may operate in a different manner in some ways. Class D amplifier 200 includes pre-conditioning circuit 240, sigma-delta modulator circuit 230, power transistor driving circuit 250, and class D output stage 260.

In operation, pre-conditioning circuit 240 provides sigma-delta modulator input signal SDIN from audio input signal IN. In one embodiment, as illustrated in FIG. 2, sigma-delta modulator input signal SDIN is a differential signal that includes signals SDINP and SDINM, and signal IN is a differential signal including signals INP and INM.

Sigma-delta modulator circuit 230 is arranged to provide sigma-delta modulator output signal SO based on signal SDIN and signal OUT. In one embodiment, signal SO includes a plurality of driver input signals.

Power transistor driving circuit 250 is arranged to drive class D output stage 260 based on signal SO to provide output signal OUT. In one embodiment, as illustrated in FIG. 2, class D amplifier 200 is arranged in a bridge-tied load configuration such that signal OUT includes two signals, OUT1 and OUT2. In one embodiment, speaker 270 operates as resistive load with a relatively small resistance, driven responsive to signal OUT.

Although differential signals are illustrated in FIG. 2, in other embodiments, some or all of the signals shown may be single-ended rather than differential. Similarly, although speaker 270 is shown in a bridge-tied load configuration in FIG. 2, in other embodiments, signals 270 may be arranged in a single-ended configuration.

Class D amplifier 200 may substantially eliminate idle channel noise because of the higher order of modulation. Most of the quantization error is shaped away from the audio band of 20 Hz–20 KHz. Also, class D amplifier 200 may have reduced EMI (electro-magnetic interference).

Figure 3:
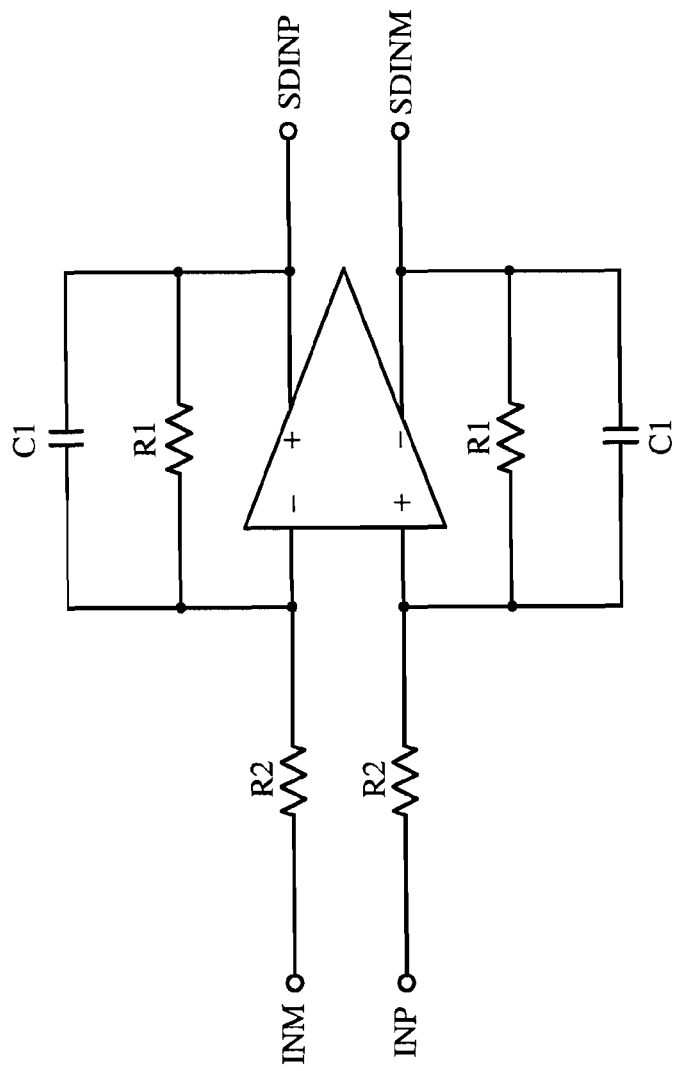
FIG. 3 schematically illustrates an embodiment of an anti-aliasing low-pass filter that may be employed as an embodiment of the pre-conditioning circuit of the class D amplifier of FIG. 2.

FIG. 3 schematically illustrates an embodiment of anti-aliasing low-pass filter 340. Anti-aliasing low-pass filter 340 may be employed as an embodiment of pre-conditioning circuit 240 of FIG. 2.

Figure 4:
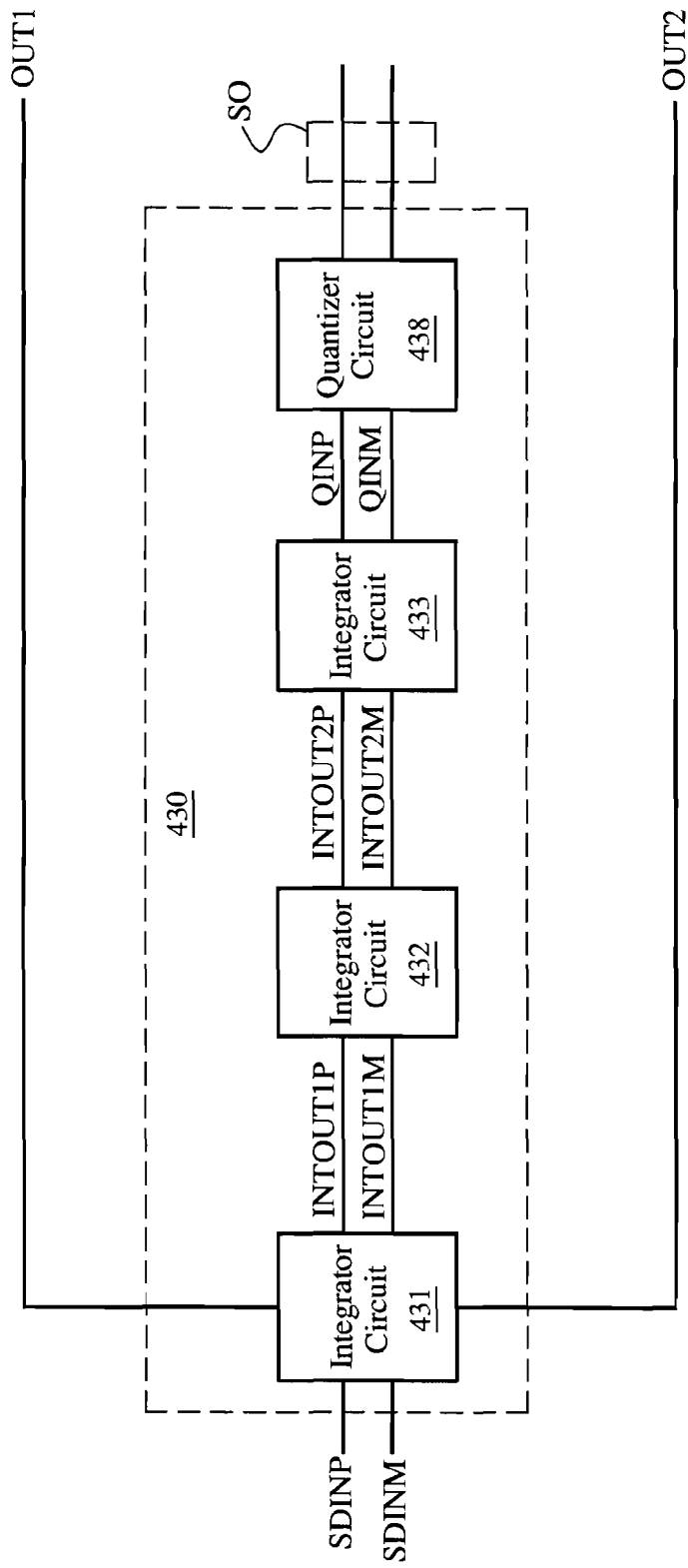
FIG. 4 shows a block diagram of an embodiment of the sigma-delta modulator circuit of FIG. 2.

FIG. 4 shows a block diagram of an embodiment of sigma-delta modulator circuit 430, which may be employed as an embodiment of sigma-delta modulator circuit 230 of FIG. 2 or sigma-delta modulator circuit 130 of FIG. 1. Sigma-delta modulator circuit 430 includes integrator circuits 431–433 and quantizer circuit 438.

In one embodiment, sigma-delta modulator circuit 430 has a differential architecture. In another embodiment, sigma-delta modulator circuit 430 has a single-ended architecture. Although a differential architecture is shown and described with reference to FIG. 4, single-ended architectures are also within the scope and spirit of the invention.

In operation, integrator circuit 431 provides first-integrator output signal INTOUT1 from signal SDIN and signal OUT. In one embodiment, signal INTOUT1 is a differential signal that includes signals INTOUT1P and INTOUT1M. Similarly, integrator circuit 432 is arranged to provide second-integrator output signal INTOUT2 from signal INTOUT1. In one embodiment, signal INTOUT2 is a differential signal that includes signals INTOUT2P and INTOUT2M. In one embodiment, integrator circuit 433 is arranged to provide quantizer input signal QIN from signal INTOUT2. In one embodiment, signal QIN is a differential signal that includes signals QINP and QINM.

Quantizer circuit 438 is arranged to provide signal SO from signal QIN.

Although three integrator circuits providing third-order sigma-modulation are shown and described with regard to FIG. 4, in other embodiments that are within the scope and spirit of the invention, more than three integrators that are arranged to provide sigma-delta modulation higher than third order may be included in sigma-delta modulation circuit 430.

Figure 5:
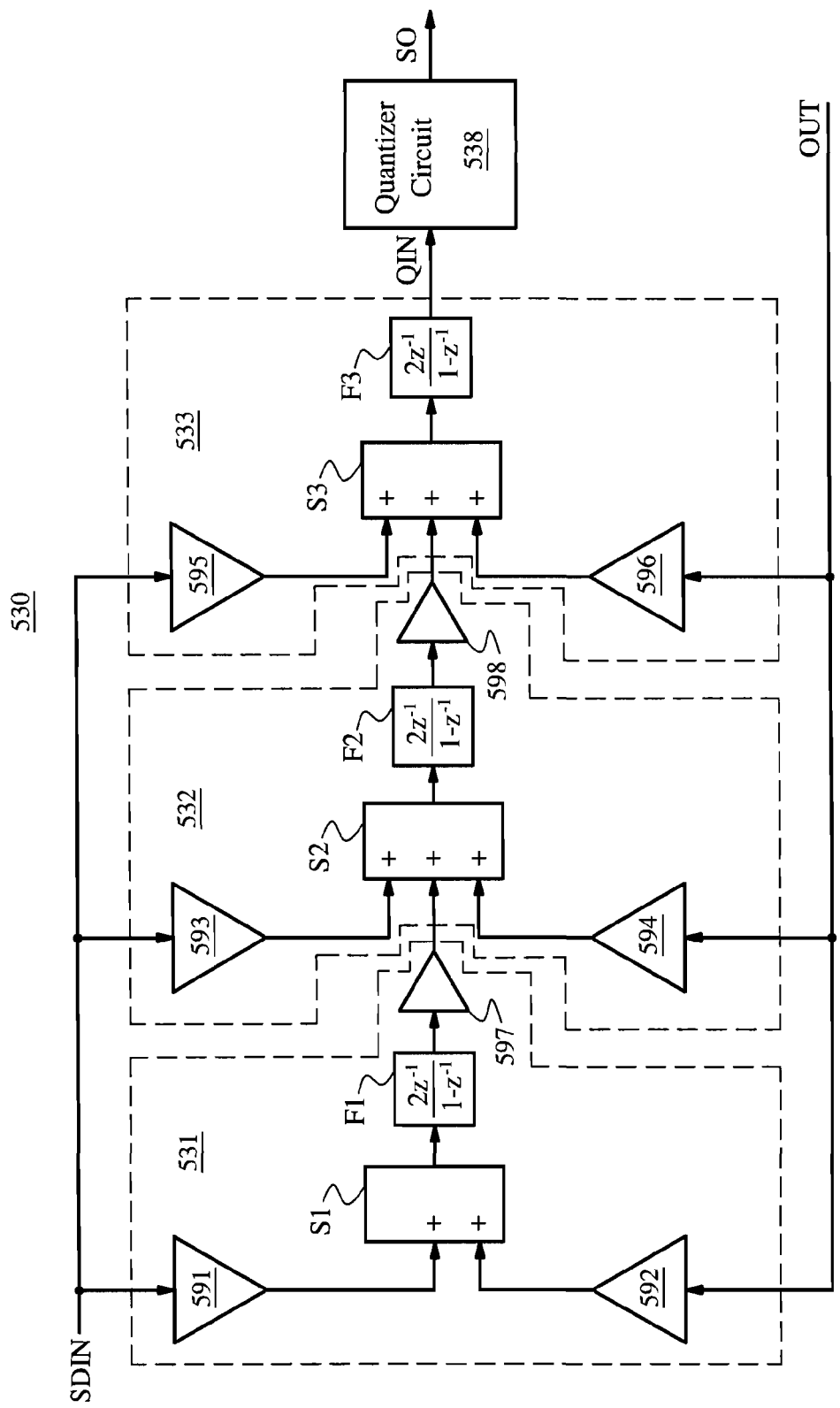
FIG. 5 illustrates a functional block diagram of an embodiment of the sigma-delta modulator circuit of FIG. 4.

FIG. 5 illustrates a functional block diagram of an embodiment of sigma-delta modulator circuit 530. Sigma-delta modulator circuit 530 may be employed as an embodiment of sigma-delta modulator circuit 430 of FIG. 4. Integrator 531 may include summer block S1; loop filter block F1; and gain blocks 591, 592, and 597. Similarly, integrator 532 may include summer block S2; loop filter block F2; and gain blocks 593, 594, and 598. Integrator 533 may include summer block S3; loop filter block F3; and gain blocks 595 and 596.

In one embodiment, sigma-delta modulator circuit 530 has a differential architecture. In another embodiment, sigma-delta modulator circuit 530 has a single-ended architecture. Although a single-ended architecture is shown and described with reference to FIG. 5, differential architectures are also within the scope and spirit of the invention.

In one embodiment, loop filter blocks F1, F2, and F3 each have a transfer function of $(2*z^{[-1]})/(1-z^{[-1]})$. In other embodiments, a transfer function other than $(2*z^{[-1]})/(1-z^{[-1]})$ may be employed. In one embodiment, gain blocks 597 and 598 are not included in sigma-delta modulator circuit 530. In one embodiment, gain blocks 591–596 each provide a gain of less than one. Each of the summing blocks S1–S3 may provide a summing function. Accordingly, each of the integrator circuit 531–533 may integrate a weighted sum.

In one embodiment, loop filter functions F1, F2, and F3 are each provided by a separate integrator with switched sample-and-hold capacitors. Also, in one embodiment, summing functions S1–S3 may each be provided by applying the signals to be summed to a summing junction coupled to a sampling capacitor in the corresponding integrator. Further, the gain provided by gain blocks 591–598 may be implemented by one or more capacitor ratios in the corresponding integrator.

Embodiments employing a two-level switching scheme are described with regard to FIGS. 6 and 7 below. Embodiments employing a three-level switching scheme are described with regard to FIGS. 8 and 9 below.

Figure 6:
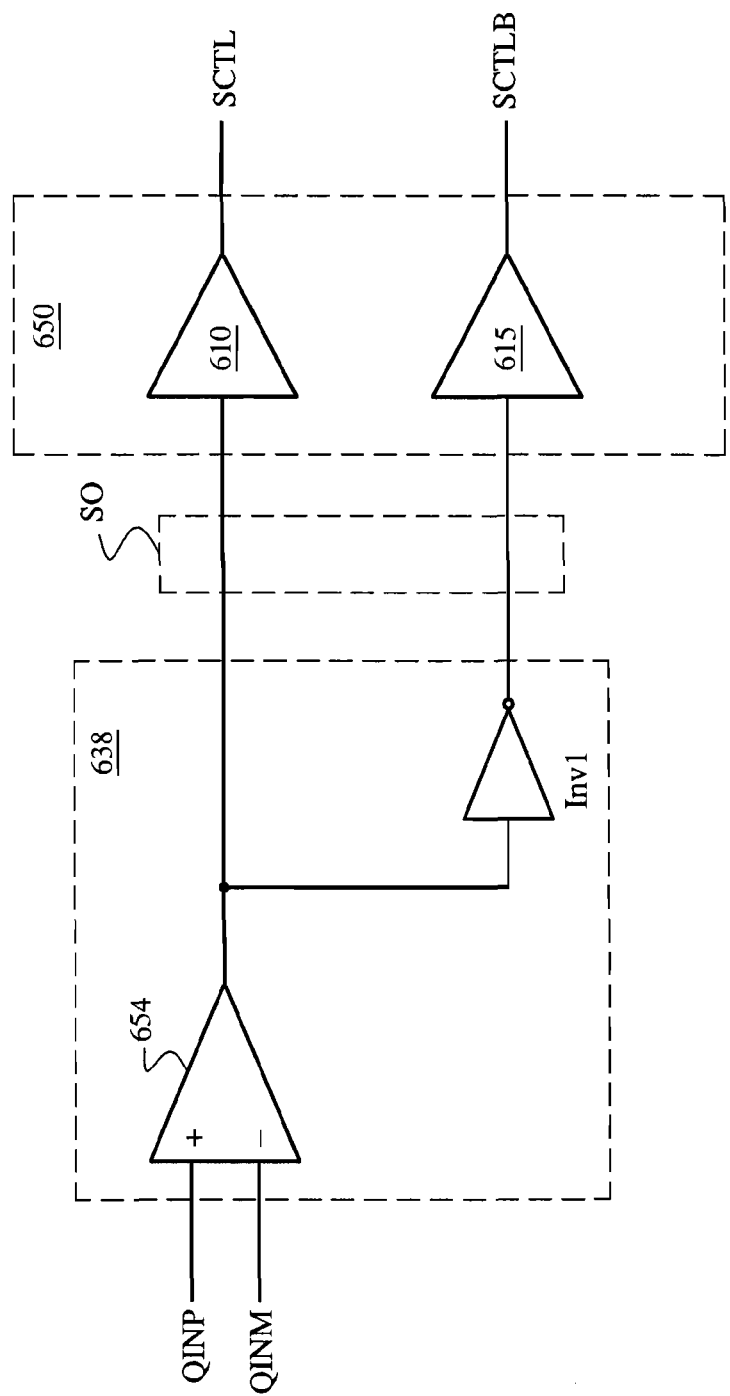
FIG. 6 shows a block diagram of an embodiment of the quantizer circuit of FIG. 4 and the power transistor driving circuit of FIG. 2.

FIG. 6 shows a block diagram of an embodiment of quantizer circuit 638 and power transistor driving circuit 650. Quantizer circuit 638 may be employed as an embodiment of quantizer circuit 438 of FIG. 4 or quantizer circuit 538 of FIG. 5, and power transistor driving circuit 650 may be employed as an embodiment of power transistor driving circuit 250 of FIG. 2. Quantizer circuit 638 includes comparator 654 and inverter Inv1. Also, power transistor driving circuit 650 includes driver circuit 610 and driver circuit 615.

In the embodiment illustrated in FIG. 6, sigma-delta modulator output signal SO includes two driver input signals. Comparator 654 is arranged to compare signal QINP to signal QINM to provide one of the driver input signals in signal SO, and inverter Inv1 is arranged to invert the signal output by comparator 654 to provide another driver input signal in signal SO. Further, driver circuits 610 and 615 are arranged to provide switch control signals SCTL and SCTLB, respectively, based on signal SO. Signal SCTLB is substantially an inverse of signal SCTL.

Quantizer circuit 638 is arranged for a two-level switching scheme. If QINP–QINM>0, signal SCTL is asserted and signal SCTLB is unasserted. Conversely, if QINP–QINM<0, signal SCTLB is asserted and signal SCTL is unasserted.

Although a differential embodiment is shown and described with regard to FIG. 6, in other embodiments, a single-ended architecture may be employed. In one embodiment in which signal QIN is a single-ended signal that varies from −VDD to VDD, if signal QIN>0, signal SCTL is asserted and signal SCTLB is unasserted; and if signal QIN<0, signal SCTLB is asserted and signal SCTL is unasserted.

Figure 7:
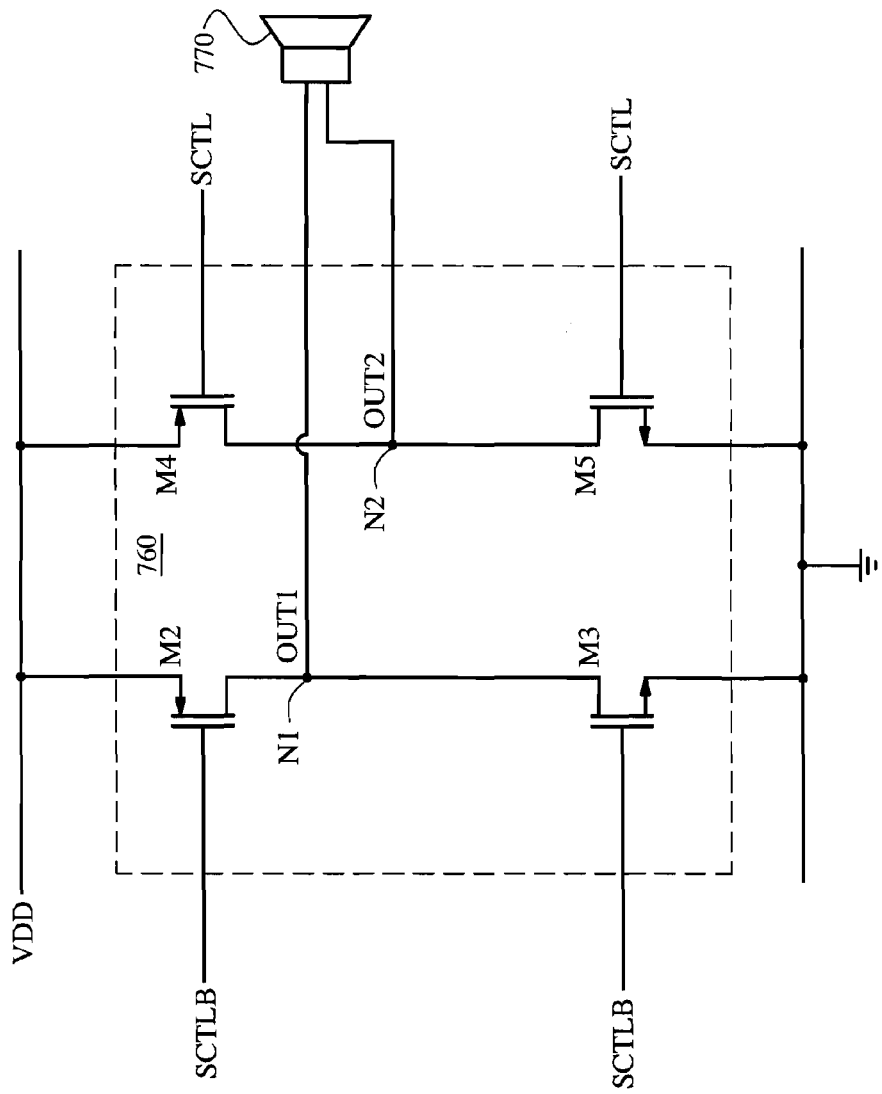
FIG. 7 schematically illustrates an embodiment of the class D output stage and speaker of FIG. 2.

FIG. 7 schematically illustrates an embodiment of class D output stage 760 and speaker 770. Class D output stage 760 and speaker 770 may be employed as embodiments of class D output stage 260 and speaker 270 of FIG. 2, respectively. Class D output stage 760 includes power transistors M2–M5.

Transistor M2 is arranged as a high-side switch that opens and closes responsive to signal SCTLB. Transistor M2 couples VDD to output node N1 if signal SCTLB is unasserted (i.e. signal SCTL is asserted). Transistor M3 is arranged as a low-side switch that opens and closes responsive to signal SCTLB. Transistor M3 couples GND to output node N1 if signal SCTLB is asserted (i.e. signal SCTL is unasserted). Transistor M4 is arranged as a high-side switch that opens and closes responsive to signal SCTL. Transistor M4 couples VDD to output node N2 if signal SCTL is unasserted (i.e. signal SCTLB is asserted). Transistor M5 is arranged as a low-side switch that opens and closes responsive to signal SCTL. Transistor M5 couples GND to output node N2 if signal SCTL is asserted.

Accordingly, if signal SCTL is asserted, output node N1 is coupled to VDD and output node N2 is coupled to ground, so that speaker 770 is driven with a differential voltage of VDD. Conversely, if signal SCTL is unasserted, output node N1 is coupled to ground and output node N2 is coupled to VDD, so that speaker 770 is driven with a differential voltage of −VDD. For an input voltage IN of zero volts, differential output voltage OUT2–OUT1 continuously switches between +VDD and −VDD with an average value of substantially zero.

Figure 8:
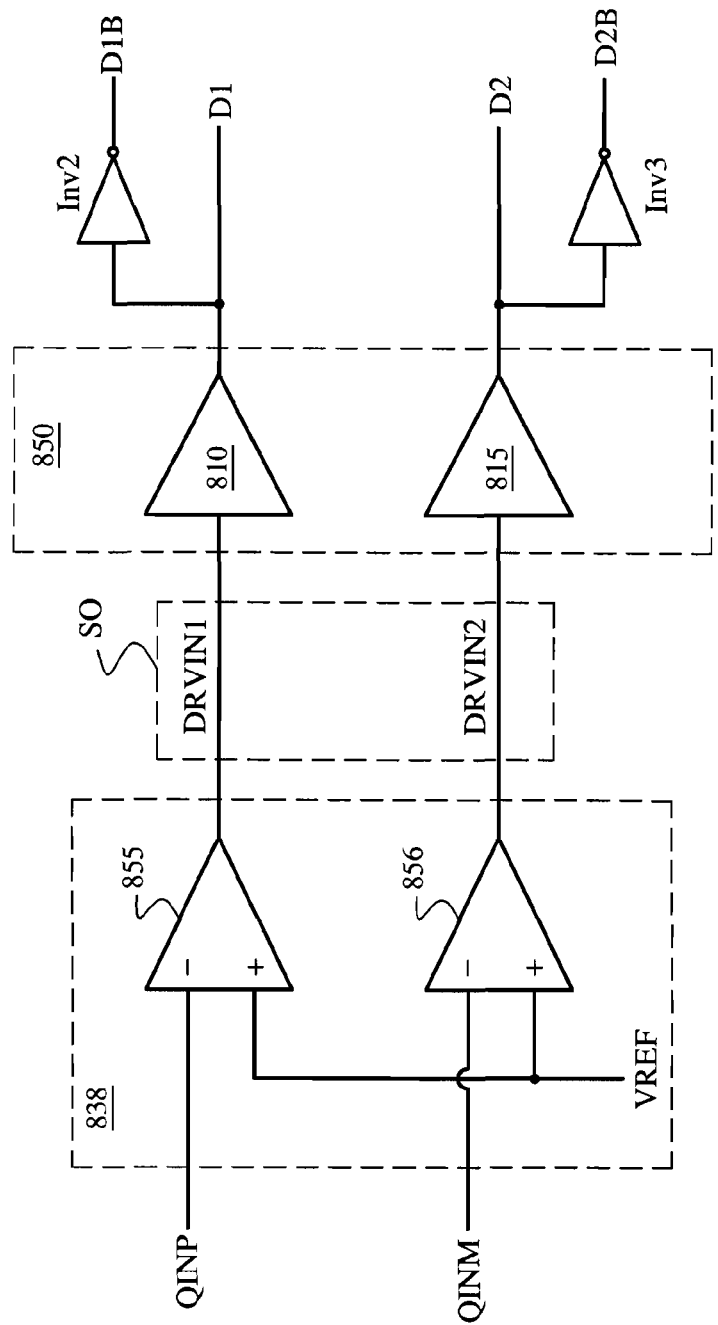
FIG. 8 shows a block diagram of an embodiment of the quantizer circuit of FIG. 4 and the power transistor driving circuit of FIG. 2 in which a three-level switching scheme is implemented.

FIG. 8 shows a block diagram of another embodiment of quantizer circuit 838 and power transistor driving circuit 850, and further shows inverters Inv2 and Inv3 according to one embodiment. Quantizer circuit 838 may be employed as an embodiment of quantizer circuit 438 of FIG. 4 or quantizer circuit 538 of FIG. 5, and power transistor driving circuit 850 may be employed as an embodiment of power transistor driving circuit 250 of FIG. 2.

In the embodiment illustrated in FIG. 8, sigma-delta modulator ouput signal SO includes driver input signals DRVIN1 and DRVIN2. Quantizer circuit 838 includes comparators 855 and 856. Also, power transistor driving circuit 850 includes driver circuits 810 and 815.

In operation, comparator 855 provides driver input signal DRVIN1 based on a comparison of signal QINP with reference signal VREF. Also, comparator 856 is arranged to provide driver input signal DRVIN2 based on a comparison of signal QINM with signal VREF.

In one embodiment, differential signal QIN, including signal QINP and QINM, has a common mode voltage of VDD/2, and signal VREF is approximately VDD/3.

Driver circuit 810 is arranged to provide driver output signal D1 from driver input signal DRVIN1. Similarly, driver circuit 815 is arranged to provide driver output signal D2 from driver input signal DRVIN2. Inverter Inv2 is arranged to provide signal D1B from signal D1, and inverter Inv3 is arranged to provide signal D2B from signal D2.

Although a differential embodiment of quantizer circuit 838 is shown and described with reference to FIG. 8, single-ended embodiments of quantizer circuit 838 are also within the scope and spirit of the invention. In one embodiment in which signal QIN is a single-ended signal, signal QIN is compared with one reference signal to provide signal DRVIN1, and is compared with another reference signal to provide signal DRVIN2.

In any case, quantizer circuit 838 is arranged to provide three-level switching. Quantizer circuit 838 is arranged to provide signals DRVIN1 and DRVIN2 to correspond to one of three different codes depending on quantizer input signal QIN. If signal QIN is within a first range (e.g. QINM<VDD/3), signal DRVIN2 is asserted and signal DRVIN1 is unasserted. If signal QIN is within a second range (e.g. QINP>VDD/3 and QINM>VDD/3), signals DRVIN1 and DRVIN2 are both unasserted. If signal QIN is within a third range (e.g. QINP<VDD/3), signal DRVIN1 is asserted and signal DRVIN2 is unasserted.

An embodiment of the circuit illustrated in FIG. 8 may be employed in class D amplifier 200 of FIG. 2. By employing this switching scheme, for an input signal IN of zero volts, both DRVIN and DRVIN2 are unasserted. The class D amplifier outputs are quiet in this case. Accordingly, in this embodiment, an LC filter need not be employed at the output of class D amplifier 200.

Figure 9:
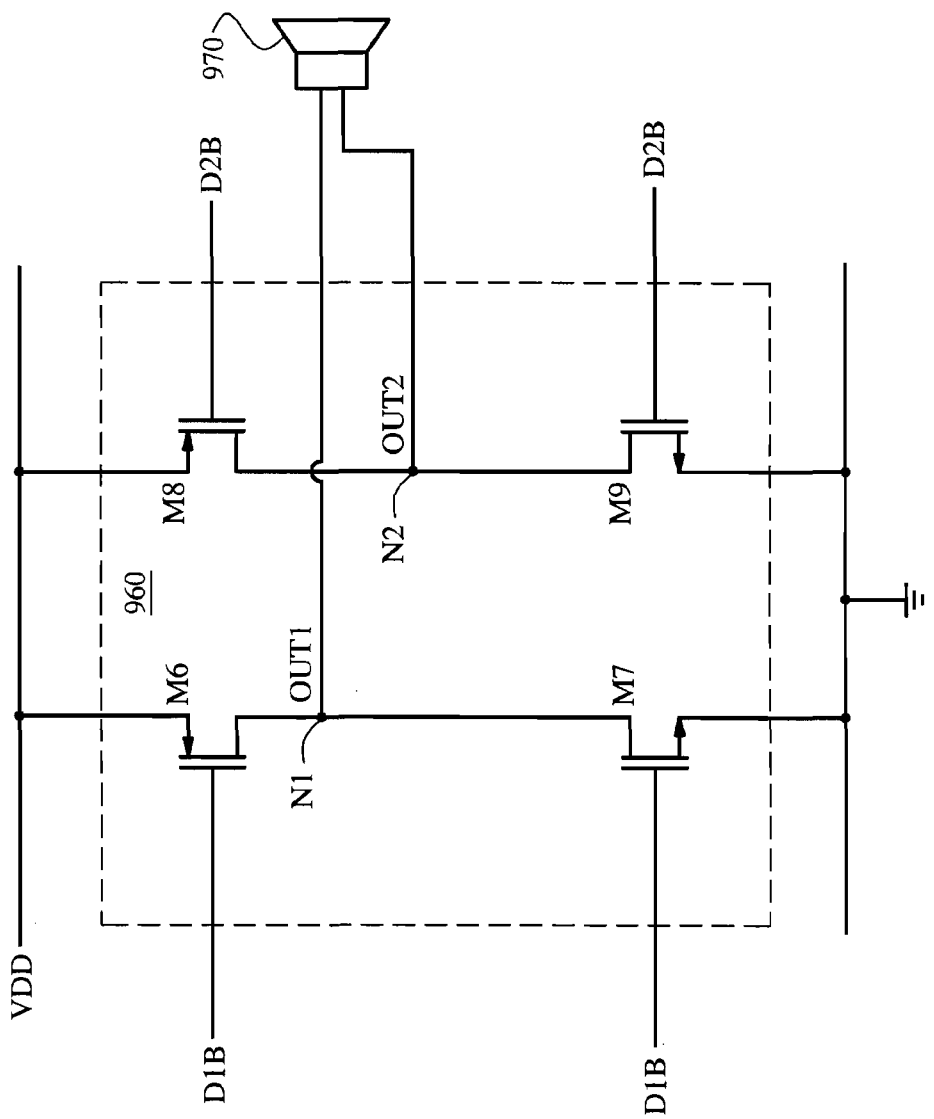
FIG. 9 schematically illustrates an embodiment of the class D output stage and speaker of FIG. 2 in which a three-level switching scheme is implemented.

FIG. 9 schematically illustrates an embodiment of class D output stage 960 and speaker 970. Class D output stage 960 and speaker 970 may be employed as embodiments of class D output stage 260 and speaker 270 of FIG. 2, respectively. Class D output stage 960 includes power transistors M6–M9. Power transistors M6 and M8 are p-type transistors, and power transistors M7 and M9 are n-type transistors.

Further, transistor M6 is arranged as a high-side switch that opens and closes responsive to signal D1B. Transistor M6 couples VDD to output node N1 if signal D1B is unasserted (i.e. signal D1 is asserted). Also, transistor M7 is arranged as a low-side switch that opens and closes responsive to signal D1B. Transistor M7 couples GND to output node N1 if signal D1B is asserted. Transistor M8 is arranged as a high-side switch that opens and closes responsive to signal D2B. Transistor M8 couples VDD to output node N2 if signal D2B is unasserted (i.e. signal D2 is asserted). Transistor M9 is arranged as a low-side switch that opens and closes responsive to signal D2B. Transistor M9 couples GND to output node N2 if signal D2B is asserted.

According to a first case, if signal D1 is asserted and signal D2 is unasserted, output node N1 is coupled to VDD and output node N2 is coupled to ground, so that speaker 970 is driven with a differential voltage of VDD. According to a second case, if signals D1 and D2 are both unasserted, output node N1 is coupled to ground and output node N2 is coupled to ground, so that speaker 970 is driven with a differential voltage of zero. According to a third case, if signal D2 is asserted and signal D1 is unasserted, output node N1 is coupled to ground and output node N2 is coupled to VDD, so that speaker 970 is driven with a differential voltage of −VDD.

Figure 10:
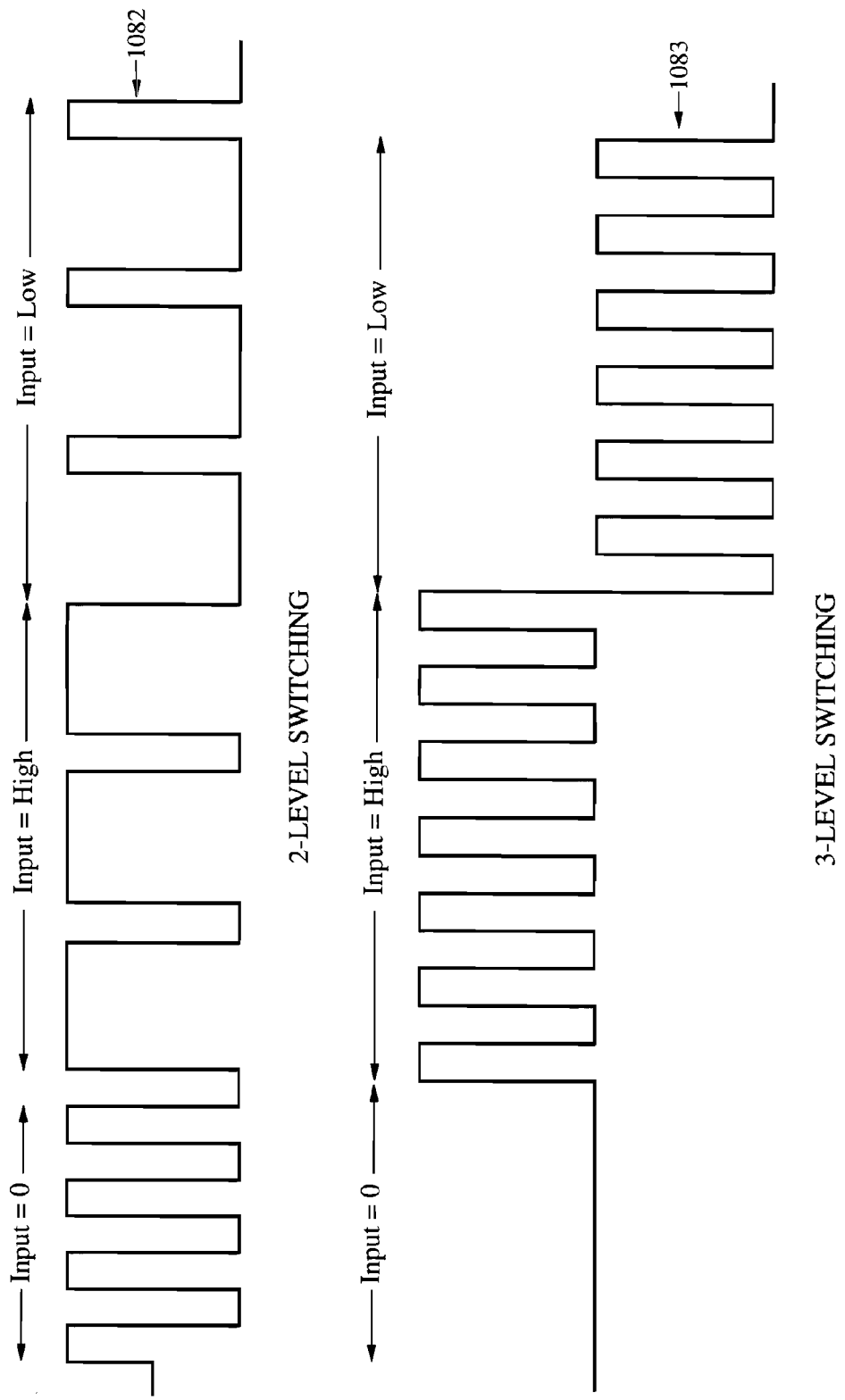
FIG. 10 shows waveforms of an output signal for two different embodiments of the class D amplifier of FIG. 2, in accordance with aspects of the present invention.

FIG. 10 shows embodiments of waveforms of an output signal for two different embodiments of class D amplifier 200 of FIG. 2.

Waveform 1082 shows an embodiment of waveform 1082 of signal OUT for an embodiment of class D amplifier 200 that employs two-level switching. As shown by waveform 1082, if input signal INP–INM is zero volts, differential output voltage OUT2–OUT1 switches between VDD and −VDD such that the average value of OUT2–OUT1 over time is substantially zero. If signal INP–INM is greater or less than zero volts, differential output voltage OUT2–OUT1 switches between +VDD and –VDD with a high or low duty cycle, respectively, so that the average value of differential output voltage OUT2–OUT1 over time is approximately equal to differential input voltage INP–INM.

Waveform 1083 shows an embodiment of waveform 1083 of signal OUT for an embodiment of class D amplifier 200 that employs three-level switching. If voltage INP–INM is zero, differential output voltage OUT2–OUT1 remains at zero. The amount of switching in the case of an input voltage near zero is significantly lower in the case of three-level switching compared to two-level switching. Accordingly, an output LC filter is not needed for embodiments of class D amplifier 200 in which three-level switching is employed.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for audio amplification, comprising:
   a first integrator circuit that is arranged to receive a sigma-delta input signal that is based, in part, on an input signal;
   a second integrator circuit;
   a third integrator circuit, wherein the first, second, and third integrator circuits are arranged to provide sigma-delta modulation for the input signal such that the sigma-delta modulation is at least third order; and wherein the third integrator circuit is arranged to provide an intermediate signal; and
   a quantizer circuit that is arranged to provide a sigma-delta modulator output signal based on the intermediate signal, and further based on a three-level switching scheme.

2. The circuit of claim 1, wherein
   the first integrator circuit is arranged to integrate a weighted sum of the input signal and an output signal to provide a first-integrator output signal;
   the second integrator circuit is arranged to integrate a weighted sum of the first-integrator output signal and the output signal to provide a second-integrator output signal;
   the third integrator circuit is arranged to integrate a weighted sum of the second-integrator output signal and the output signal to provide the intermediate signal.

3. The circuit of claim 1, wherein
   the quantizer circuit is arranged to provide the sigma-delta modulator output signal such that the sigma-delta modulator output signal includes a first driver input signal and a second driver input signal.

4. The circuit of claim 3, wherein the quantizer circuit is arranged to provide the first and second driver input signals such that:
   if the intermediate signal corresponds to a first range, the first driver input signal is asserted;
   if the intermediate signal corresponds to a second range, the first and second driver input signals are each unasserted; and
   such that if the intermediate signal corresponds to a third range, the second driver input signal is asserted.

5. The circuit of claim 4, further comprising:
   a plurality of switches arranged to provide a class D output such that:
   the class D output corresponds to substantially a power supply voltage (VDD) if the first driver input signal is asserted;
   the class D output corresponds to substantially zero if the first and second driver input signals are each unasserted; and
   the class D output corresponds to substantially –VDD if the second driver input signal is asserted.

6. The circuit of claim 3, wherein
   the third integrator circuit is arranged to provide the third-integrator signal as a differential signal including a first half and a second half, and wherein the quantizer circuit includes:
   a comparator that is arranged to compare a first half of the third-integrator signal to a reference voltage, and to provide the first driver signal based on the comparison; and
   another comparator that is arranged to compare the second half of the third-integrator signal to the reference voltage, and to provide the second driver signal based on the comparison of the second half of the third-integrator signal to the reference voltage.

7. The circuit of claim 3, further comprising:
   a first high-side switch circuit that is coupled between a power supply node and a first output node, wherein the first high-side switch is arranged to close if the first driver signal is asserted, and further arranged to open if the first driver circuit is unasserted;
   a first low-side switch circuit that is coupled between the first output node and a ground node, wherein the first low-side switch circuit is arranged to open if the first driver signal is asserted, and further arranged to close if the first driver circuit is unasserted;
   a second high-side switch circuit that is coupled between the power supply node and a second output node, wherein the second high-side switch is arranged to close if the second driver signal is asserted, and further arranged to open if the second driver circuit is unasserted;
   a second low-side switch circuit that is coupled between the second output node and the ground node, wherein the second low-side switch circuit is arranged to open if the second driver signal is asserted, and further arranged to close if the second driver circuit is unasserted.

8. The circuit of claim 7, further comprising a speaker that is coupled between the first and second output nodes.

9. A circuit for audio amplification, comprising:
   a class D power amplifier that is arranged to receive an input signal, wherein the class D amplifier includes:
   a sigma-delta modulator that is arranged to provide a sigma-delta modulator output signal, wherein the sigma-delta modulator includes:
   a first integrator circuit;
   a second integrator circuit; and
   a third integrator circuit, wherein the first, second, and third integrator circuits are arranged to provide sigma-delta modulation for the input signal such that the sigma-delta modulation is at least third order;
   a first driver circuit that is arranged to drive a power transistor based, in part, on the sigma-delta modulator output signal; and
   a second driver circuit that is arranged to drive another power transistor based, in part, on the sigma-delta modulator output signal and wherein the class D power amplifier is arranged for three level switching.

10. The circuit of claim 9, wherein the class D amplifier further includes:
an anti-aliasing low-pass filter that is arranged to provide a sigma-delta input signal from the input signal, wherein the first integrator is arranged to receive the sigma-delta input signal.

11. The circuit of claim 9, wherein the sigma-delta modulation is one of third-order sigma-delta modulation and fourth-order sigma-delta modulation.

12. The circuit of claim 11, wherein the sigma-delta modulation is third-order sigma-delta modulation.

13. The circuit of claim 9, wherein the third integrator circuit is arranged to provide an intermediate signal that is based on the sigma-delta modulation, and wherein the sigma-delta modulator further includes a quantizer circuit that is arranged to provide the sigma-delta modulator output signal based on the intermediate signal.

14. The circuit of claim 13, wherein the quantizer circuit is arranged to provide the sigma-delta modulation output signal based on a two-level switching scheme.

15. The circuit of claim 13, wherein the quantizer circuit is arranged to provide the sigma-delta modulation output signal based on a three-level switching scheme.

16. The circuit of claim 15, wherein the class D amplifier circuit includes:
a first p-type power transistor that is coupled between a power supply node and a first output node;
a first n-type power transistor that is coupled between the first output node and a ground node;
a second p-type power transistor that is coupled between the power supply node and a second output node;
a second n-type power transistor that is coupled between the second output node and a ground node; and
a power transistor driving circuit, wherein the sigma-delta modulator output signal includes a first driver input signal and a second driver input signal, the intermediate signal is a differential signal including a first half and a second half, the quantizer circuit includes a first comparator and a second comparator, the first comparator is arranged to compare the first half of the intermediate signal to a reference voltage to provide the first driver input signal, the second comparator is arranged to compare the second half of the intermediate signal to the reference voltage to provide the second driver input signal, and wherein the power transistor driving circuit is arranged to drive the first and second p-type power transistors and the first and second n-type power transistors such that:
if the first driver input signal is asserted, the first p-type transistor is turned on and the first n-type transistor is turned off;
if the first driver input signal is unasserted, the first p-type transistor is turned off and the first n-type transistor is turned on;
if the second driver input signal is asserted, the second p-type transistor is turned on and the second n-type transistor is turned off;
if the second driver input signal is unasserted, the second p-type transistor is turned off and the second n-type transistor is turned on.

17. A method for audio amplification, comprising:
performing sigma-delta modulation for an input signal such that the sigma-delta modulation is at least third order, and such that a sigma-delta modulation output signal is provided based on the sigma-delta modulation;
driving a power transistor based, in part, on the sigma-delta modulation output signal; and
driving another power transistor based, in part, on the sigma-delta modulation output signal and further based on a three level switching scheme.

18. The method of claim 17, wherein
the sigma-delta modulation output signal includes a plurality of driver input signals; performing the sigma-delta modulation includes performing at least three integrations to provide an intermediate signal, and further includes providing the plurality of driver input signals based on the intermediate signal.

19. The method of claim 18, wherein providing the plurality of driver input signals is accomplished according to the three-level switching scheme.

20. The method of claim 19, further comprising:
driving a speaker based on driving the power transistor and the other power transistor,
wherein the intermediate signal is a differential signal including a first half and a second half;
providing the plurality of driver input signals includes:
comparing the first half of the intermediate signal with a reference voltage, and providing a first of the plurality of driver input signals based on the comparison; and
comparing the second half of the intermediate signal with the reference voltage, and providing a second of the plurality of driver input signals based on the comparison;
the speaker is coupled between a first node and a second node; and
wherein driving the speaker is accomplished such that driving the speaker includes:
if the intermediate signal corresponds to a first range, driving the first node to substantially a power supply voltage (VDD) and driving the second node to substantially ground;
if the intermediate signal corresponds to a second range, driving the first node to substantially ground and driving the second node to substantially ground; and
if the intermediate signal corresponds to a third range, driving the first node to substantially ground and driving the second node to substantially VDD.

* * * * *

UNITED STATES PATENT AND TRADEMARK OFFICE
CERTIFICATE OF CORRECTION

| | |
|---|---|
| PATENT NO. | : 7,170,340 B2 |
| APPLICATION NO. | : 11/043628 |
| DATED | : January 30, 2007 |
| INVENTOR(S) | : Ansuya Bhatt et al. |

It is certified that error appears in the above-identified patent and that said Letters Patent is hereby corrected as shown below:

Column 5; Line 48; Delete "ouput" and insert -- output --, therefor.

Column 8; Line 66; In Claim 9, after "signal" insert -- , --.

Column 10; Line 13; In Claim 17, after "signal" insert -- , --.

Signed and Sealed this

Tenth Day of April, 2007

JON W. DUDAS
*Director of the United States Patent and Trademark Office*